United States Patent
Ashraf et al.

(10) Patent No.: US 11,489,106 B2
(45) Date of Patent: Nov. 1, 2022

(54) METHOD OF PLASMA ETCHING

(71) Applicant: SPTS Technologies Limited, Newport (GB)

(72) Inventors: Huma Ashraf, Newport (GB); Kevin Riddell, Newport (GB); Codrin Prahoveanu, Newport (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 17/101,951

(22) Filed: Nov. 23, 2020

(65) Prior Publication Data
US 2021/0193908 A1 Jun. 24, 2021

(30) Foreign Application Priority Data
Dec. 23, 2019 (GB) ..................... 1919220

(51) Int. Cl.
H01L 21/3065 (2006.01)
H01L 41/332 (2013.01)
H01J 37/32 (2006.01)

(52) U.S. Cl.
CPC ........ H01L 41/332 (2013.01); H01J 37/3244 (2013.01); H01J 37/32715 (2013.01); *H01J 2237/334* (2013.01)

(58) Field of Classification Search
None
See application file for complete search history.

(56) References Cited

U.S. PATENT DOCUMENTS

| 6,071,828 A | 6/2000 | Mihara |
| 6,770,567 B2 | 8/2004 | Ko et al. |
| 6,828,161 B2 * | 12/2004 | Summerfelt ...... H01L 27/11507 257/E21.664 |
| 7,439,188 B2 | 10/2008 | Deornellas et al. |
| 2003/0013314 A1 | 1/2003 | Ying et al. |

(Continued)

FOREIGN PATENT DOCUMENTS

EP   0648858 A1   4/1995

OTHER PUBLICATIONS

IPO, Search Report for GB Application No. 1919220.2, dated Jun. 8, 2020.

(Continued)

*Primary Examiner* — Shamim Ahmed
(74) *Attorney, Agent, or Firm* — Hodgson Russ LLP

(57) ABSTRACT

A structure comprising a semiconductor substrate and a layer of PZT (lead zirconate titanate) is etched by performing a first plasma etch step with a first etch process gas mixture. The first etch process gas mixture comprises at least one fluorine containing species. The first plasma etch step is performed so that involatile metal etch products are deposited onto interior surfaces of the chamber. The structure is further etched by performing a second plasma etch step with a second etch process gas mixture. The second etch process gas mixture comprises at least one fluorocarbon species. The second plasma etch step is performed so that a fluorocarbon polymer layer is deposited onto interior surfaces of the chamber to overlay involatile metal etch products deposited in the first plasma etch step and to provide a substrate on which further involatile metal etch products can be deposited.

16 Claims, 4 Drawing Sheets

(56) References Cited

U.S. PATENT DOCUMENTS

| | | |
|---|---|---|
| 2004/0157459 A1 | 8/2004 | Ying et al. |
| 2005/0227378 A1* | 10/2005 | Moise .............. H01L 21/31116 257/E21.59 |
| 2007/0178698 A1 | 8/2007 | Okita et al. |
| 2009/0071404 A1* | 3/2009 | Tada ...................... C23C 16/08 134/1.1 |
| 2013/0115781 A1* | 5/2013 | Matsumoto ....... H01L 21/32136 438/726 |
| 2019/0139781 A1 | 5/2019 | Katsunuma |

OTHER PUBLICATIONS

EPO, Extended European Search Report for EP Application No. 20202083.0, dated Apr. 13, 2021.

* cited by examiner

METHOD OF PLASMA ETCHING

CROSS-REFERENCE TO RELATED APPLICATIONS

This application claims priority to UK Patent Application No. 1919220.2 filed Dec. 23, 2019, the disclosure of which is hereby incorporated by reference.

FIELD OF THE DISCLOSURE

The present invention relates to a method of plasma etching, particularly a method of plasma etching a structure comprising a substrate and a layer of PZT (lead zirconate titanate).

BACKGROUND OF THE DISCLOSURE

Piezoelectric materials are used in a variety of industrial applications, including sensor and actuator applications such as ultrasound transducers, AFM actuators and in microelectronics for the fabrication of non-volatile memory devices. One of the most common piezoelectric materials is PZT (lead zirconate titanate).

The manufacture of PZT-based piezoelectric devices typically involves plasma processing, including plasma etching. An undesirable side effect of the etching process is a build-up of material on the chamber interior. Once the material reaches a certain thickness, the chamber must be cleaned periodically to prevent the material from flaking away from the chamber walls and contaminating the system. This period is known as the mean time between cleans (MTBC). A longer MTBC is desired, as this increases the productivity of the plasma apparatus.

Plasma etching of PZT layers presents particular technical problems, especially at large wafer diameter (>150 mm) and high open areas (>80%). PZT piezoelectric devices typically use noble metal electrodes such as Pt. The etch by-products are largely involatile, resulting in the coating of process chamber internals with films rich in Pb, Zr and Ti from the PZT and PT from the electrodes, along with by-products of process gases used during etching such as carbon, fluorine and oxygen. Whilst the use of $O_2$ batch cleans and $O_2$ inter-wafer cleans can minimise carbon based by-product deposition, the remaining by-products are involatile, and therefore difficult to remove by dry etching. Beyond a certain thickness, variation of film stress in the deposited material can lead to flaking of deposited material. This is worsened by the presence of thermal gradients in the chamber, and/or thermal cycling during idle time, and/or points of poor adhesion. Flaking causes increased numbers of particles and defects on processed wafers. It then becomes necessary to open the vacuum chamber to atmosphere and clean the interior of the chamber using wet/mechanical methods. This results in a MTBC which is lower than desirable. Additionally, flaking of material onto an electrostatic chuck (ESC) can disturb the integrity of the clamping force applied by the ESC. This affects heat transfer between the PZT containing structure and the ESC, leading to non-uniform wafer cooling and a resulting deterioration in process performance. Ultimately this results in defective product. Therefore, there are significant economic consequences associated with flaking, as tool productivity is reduced and also unexpected particle generation can adversely affect device yield. However, as the demand for PZT based devices grows there is an increasing requirement to improve plasma etch processing of the materials in order to improve device yield and increase the productivity of the etch systems.

The present invention, in at least some of its embodiments, is directed to one or more of the problems and desires disclosed above.

BRIEF SUMMARY OF THE DISCLOSURE

According to an aspect of the invention there is provided a method of plasma etching a structure comprising a substrate and a layer of PZT (lead zirconate titanate), the method comprising the steps of:

providing a structure comprising a substrate and a layer of PZT;

positioning the structure on a support within a chamber;

etching the structure by performing a first plasma etch step in which a first etch process gas mixture is supplied to the chamber, wherein the first etch process gas mixture comprises at least one fluorine containing species and the first plasma etch step is performed so that involatile metal etch products are deposited onto interior surfaces of the chamber; and further etching the structure by performing a second plasma etch step in which a second etch process gas mixture is supplied to the chamber, wherein the second etch process gas mixture comprises at least one fluorocarbon species and the second plasma etch step is performed so that a fluorocarbon polymer layer is deposited onto interior surfaces of the chamber to overlay involatile metal etch products deposited in the first plasma etch step and to provide a substrate on which further involatile metal etch products can be deposited.

In accordance with a further aspect of the invention there is provided a plasma etching apparatus for plasma etching a structure comprising a substrate and a layer of PZT (lead zirconate titanate), the apparatus comprising:

a chamber;

a support located within the chamber on which the structure can be positioned;

a plasma production device; and a controller configured to control the apparatus to perform a two-step etch process comprising: a first plasma etch step in which a first etch process gas mixture is supplied to the chamber, the first etch process gas mixture comprising at least one fluorine containing species, wherein the first plasma etch step is performed so that involatile metal etch products are deposited onto interior surfaces of the chamber; and a second plasma etch step in which a second etch process gas mixture is supplied to the chamber, the second etch process gas mixture comprising at least one fluorocarbon species, wherein the second plasma etch step is performed so that a fluorocarbon polymer layer is deposited onto interior surfaces of the chamber to overlay involatile metal etch products deposited in the first plasma etch step and to provide a substrate on which further involatile metal etch products can be deposited.

The inventors have found that the presence of a fluorocarbon polymer layer between layers of deposited involatile metal etch products improves adhesion of metal etch products to the chamber interior, thereby preventing flaking of deposited material. In this way, the number of wafers which can be processed before the apparatus must be cleaned is increased.

An advantage of the present invention is that the fluorocarbon polymer layer is deposited during the etching process. No pre-wafer treatment or dummy wafer is required. Also, a laminar film structure can therefore be attained while maximising wafer throughput. The laminar film structure can be built up when a number of PZT containing structures are etched successively by the two-step etch process of the invention. The fluorocarbon polymer layer deposited during the second plasma etch step acts as a favourable substrate for the deposition of involatile metal etch products during the subsequent first plasma etch step (whether performed on a subsequently processed structure or, if a cyclical process is used, on the same structure). This increases adhesion between deposited metal layers. A stable laminar structure comprising many layers can be built up in this way, resulting in an increased MTBC.

In relation to the first and second etch process gas mixtures, when reference is made to 'open-ended' terms such as 'comprising', 'comprise' and 'comprises', the invention is understood to relate also to embodiments in which the open-ended terms are replaced by 'closed' terms such as 'consisting of' and 'consisting essentially of'.

The at least one fluorocarbon species of the second etch process gas mixture can comprise $C_4F_8$. The $C_4F_8$ can be introduced into the chamber at a flow rate of 5-10 sccm.

Alternatively or additionally, the at least one fluorocarbon species of the second etch process gas mixture can comprise $CF_4$ and/or $C_3F_8$. The at least one fluorocarbon species of the second etch process gas mixture can comprise $CF_4$ and the second etch process gas mixture can further comprise $H_2$. The ratio of $CF_4$ to $H_2$, expressed as a ratio of flow rates in sccm, can be less than 1.0:1.

The at least one fluorine containing species of the first etch process gas mixture can comprise one or more of $CF_4$, $CHF_3$, $C_4F_8$, $C_3F_8$ and $SF_6$. The first etch process gas mixture can further comprise $H_2$. The first etch process gas mixture can comprise $CF_4$ and $H_2$. The ratio of $CF_4$ to $H_2$, expressed as a ratio of flow rates in sccm, can be 1.5:1 or greater.

The first etch process gas mixture can consist essentially of $CF_4$, $H_2$ and, optionally, one or more inert diluents such as Ar.

The second etch process gas mixture can consist essentially of $C_4F_8$, $CF_4$, $H_2$ and, optionally, one or more inert diluents such as Ar.

An electrical bias power may be applied to the support during the first plasma etch step and a reduced or zero electrical bias power applied to the support during the second plasma etch step. The electrical bias power can be an RF bias power. An electrical bias power of 500-1000 W can be applied to the support during the first plasma etch step. An electrical bias power of 0-500 W can be applied to the support during the second plasma etch step. The bias power controls the rate at which the structure is etched by the plasma. The bias power is tuned to etch the structure at a high rate with low selectivity to PZT during the first step. The lower bias power in the second step leads to selective etching of PZT surfaces. The plasma etching apparatus can comprise a power applying arrangement for applying an electrical bias power such as an RF bias power to the support.

A structure can be plasma etched using a single first plasma etch step and a single second plasma etch step. Alternatively, it is possible to etch a structure in a cyclical way by alternately repeating the first and second plasma etch steps a desired number of times. Therefore, the method can further comprise the steps of: yet further etching the structure by performing the first plasma etch step; and yet further etching still the structure by performing the second plasma etch step.

The interior surfaces of the chamber may be textured prior to the commencement of the etching of a series of structures to improve adhesion of an initial layer of the involatile metal etch products to the interior surfaces.

The layer of PZT can be separated from the substrate by one or more layers of other material. The layer of PZT can comprise a lower surface. The lower surface can be separated from the substrate by an electrode layer, such as a noble metal layer, for example Pt. Additionally or alternatively, the layer of PZT can be separated from the semiconductor substrate by a barrier layer such as $SiO_2$. The layer of PZT can comprise an upper surface. An electrode layer, such as a layer of Pt or another noble metal, can be present on the upper surface. The structure can further comprise a photoresist layer or other mask material. The substrate can be a semiconductor substrate such as a silicon substrate.

In some embodiments the chamber has a first gas inlet arrangement comprising one or more gas inlets and a second gas inlet arrangement comprising one or more gas inlets. During the first plasma etch step, the first etch process gas mixture is only supplied to the chamber through the first gas inlet arrangement. During the second plasma etch step, the second etch process gas mixture is only supplied to the chamber through the second gas inlet arrangement. Accordingly, the controller can be configured to control the first and second gas inlet arrangements so that the structure is etched by performing the first plasma etch step using the first etch process gas mixture which is only supplied to the chamber through the first gas inlet arrangement, and further etched by performing the second plasma etch step using the second etch process gas mixture which is only supplied to the chamber through the second gas inlet arrangement.

In this way, a two-step PZT etching process is provided with gas inlet switching to extend the mean time between chamber cleans. It is believed that the higher concentration of precursor gases in the vicinity of the gas inlet leads to increased deposition around the gas inlet. By utilising a two-step etch process with switched gas inlets, the present invention provides greater uniformity in chamber deposition and thereby further extends the MTBC.

The gas inlets of the first gas inlet arrangement can be located radially inwardly of the gas inlets of the second gas inlet arrangement or vice versa. The chamber can further comprise a plasma production device. The plasma production device can separate the gas inlets of the first gas inlet arrangement from the gas inlets of the second gas inlet arrangement.

The plasma production device can comprise an annular housing and a plasma generating element disposed within the annular housing. The gas inlets of the first gas inlet arrangement can be located radially inwardly of the annular housing and the gas inlets of the second gas inlet arrangement can be located radially outwardly of the annular housing or vice versa. The plasma generating element can be an RF antenna. The annular housing can be formed from a ceramic material.

The first and second gas inlet arrangements can each comprise any suitable number of gas inlets. In principle, the first and/or the second gas inlet arrangements can have a single gas inlet although in practice it is more likely that each gas arrangement will have a plurality of gas inlets.

In general, the first and second plasma etch steps use different etch process gas mixtures. Typically, the involatile metal etch products comprise Pb, Zr and Ti from the PZT and metal (such as Pt) from the electrodes, although the relative proportions may vary depending on the process conditions employed. It is understood that the fluorocarbon polymer layer may contain other constituents, such as certain proportions of the involatile metal etch products.

The substrate can be in the form of a wafer. When the substrate is a semiconductor substrate it is typically in the form of a wafer.

Different kinds of plasma production devices suitable for plasma etching are well known to the skilled reader. The present invention can be used in conjunction with a variety of these plasma production devices.

Whilst the invention has been described above, it extends to any inventive combination of features set out above or in the following description. For example, features described in relation to one aspect of the invention are disclosed in relation to another aspect of the invention. Although illustrative embodiments of the invention are described in detail herein with reference to the accompanying drawings, it is to be understood that the invention is not limited to these precise embodiments. Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

DESCRIPTION OF THE DRAWINGS

The invention will now be described, by way of example only, with reference to the accompanying drawings, in which:

FIG. 3 shows deposition on the RF source window, and indicates the areas which FIGS. 4 and 5 correspond to;

DETAILED DESCRIPTION OF THE DISCLOSURE

Figure 1:
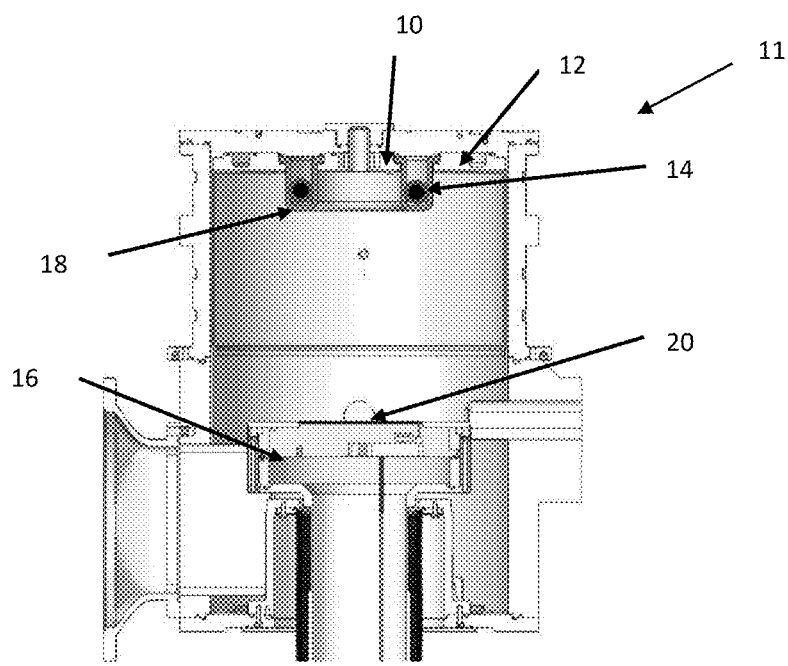
FIGS. 1 and 2 are schematic diagrams of a plasma etching apparatus of the invention.
Figure 2:
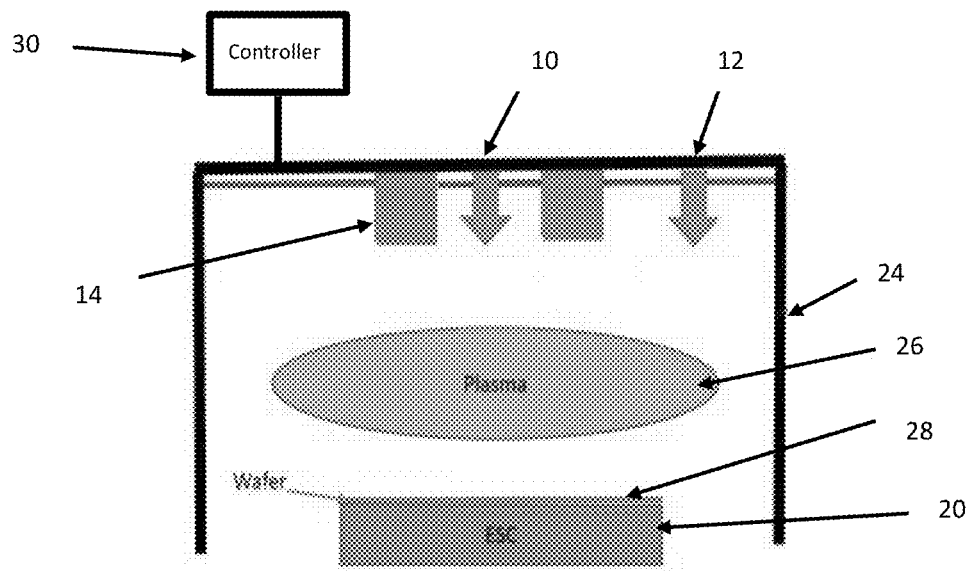

A plasma processing apparatus according to the invention is illustrated in FIGS. 1 and 2. The invention may be performed in an adapted version of the Applicant's Omega® Synapse™ etch process module. Well known features such as the exhaust gas pumping system are not shown in FIGS. 1 and 2 but will be well understood by the skilled reader.

The apparatus comprises a plasma etch chamber 11 having a plurality of internal surfaces. The apparatus comprises a first gas inlet arrangement 10, a second gas inlet arrangement 12, a ceramic annular housing 18, an RF antenna 14, a platen RF electrode 16 and a support 20 for supporting a structure 28 undergoing etching. In the embodiment shown in FIGS. 1 and 2, the support 20 is an electrostatic chuck and the platen RF electrode 16 is used to control the directionality of the etch ions. This in turn controls the extent of physical etching achieved during processing. Higher platen powers will increase the substrate etch rate.

The plasma etch chamber 11 has an upper wall or lid. The annular housing 18 is immersed within the chamber 11 and depends downwardly from the upper wall. The annular housing 18 defines a circular region on the interior of the upper wall.

In the embodiment shown in FIGS. 1 and 2, the first gas inlet arrangement 10 is an inner gas plenum and the second gas inlet arrangement 12 is an outer gas plenum. Each gas inlet arrangement comprises a plurality of gas inlets, each gas inlet terminating in an opening through which process gases enter the interior of the chamber 11. The inner plenum 10 sits within the circular region defined by the annular housing 18. The gas inlets of the inner gas plenum 10 are positioned inwardly of the annular housing 18 as a plurality of openings disposed in a circular pattern. The outer plenum 12 is positioned outside the circular region defined by the annular housing 18. The gas inlets of the outer gas plenum 10 are positioned outwardly of the annular housing 18 as a plurality of openings disposed in a circular pattern. The inner gas plenum can have eight gas inlets whereas the outer gas plenum may have about 10 times as many gas inlets. However, it will be appreciated that the first and second gas inlet arrangements can have any suitable number of gas inlets.

The etch chamber is further illustrated in FIG. 2, which illustrates processing of a structure 28 present in the chamber. The chamber comprises a chamber walls 24 within which the structure 28 is placed on the support 20. The plasma 26 is ignited and sustained by RF power coupled into the chamber from an RF power source (not shown) via the RF antenna 14 contained within the annular housing 18. The annular housing 18 acts as a window which allows RF power to be coupled into the chamber. Etch process gases enter the chamber through the gas inlets of either the inner gas plenum 10 or the outer gas plenum 12. A controller 30 is used to control the two step etch process. As part of its operation, the controller 30 controls the flow of the etch process gases into the chamber. In some embodiments, the controller switches the gas entry points from the first gas plenum to the second gas plenum between the first and second etch steps.

A typical wafer structure is a silicon substrate base layer followed by an $SiO_2$ layer, a platinum layer, a PZT layer, a second platinum layer and finally a photoresist mask on the upper surface of the wafer. The photoresist mask protects the wafer from plasma etching. The mask is patterned according to the desired etch product. Typically, the platinum electrode layers will have a thickness of 50-250 nm and the PZT layer will have a thickness of 500-2500 nm.

During the first step, a higher platen power is used to etch the PZT at a high rate, with low selectivity, to a stop layer (PZT/Pt). The stop layer is typically a platinum electrode. The platen power is reduced in the second step and may be switched off entirely. The reduced platen power leads to a reduced etch rate of PZT but improves selectivity with Pt. This means that during the second step the plasma will continue to etch any remaining PZT but will not etch the stop layer or remove Pt at a substantially reduced rate.

The internal surfaces of the chamber were textured to improve the adhesion of the first layer of deposited material. The metal shielding in the chamber was coated with arc-spray Al to achieve a surface roughness of approximately 20-35 μm while the ceramic window 18 was coated with an yttria coating to achieve a surface roughness of approximately 6 μm. Trials were conducted by etching high open area (80% OA) patterned wafers having photoresist mask (4.5 μm thickness)/Pt (100 nm thickness)/PZT (2 μm thickness)/Pt (100 nm thickness) layers formed thereon, using the process conditions shown in Table 1 with either the inner or outer gas plenum used to deliver the etch process gases.

Table 1 shows typical process parameters for each step. PZT etching is typically performed at a chamber temperature of 55° C. and a pressure of 5-50 mTorr.

TABLE 1

|  | Step 1 | Step 2 |
|---|---|---|
| $C_4F_8$ flow (sccm) | 0 | 5-10 |
| $CF_4$:$H_2$ ratio | >1.5:1 | <1:1 |
| Antenna RF power (W) | 1000-1500 | 1500-1900 |
| Platen RF power (W) | 500-1000 | 0-500 |
| Time (min) | 5-10 | 10-15 |

It was found that when the outer gas plenum was used to perform an etch step, deposition was evident on the chamber surface in the vicinity of the outer gas plenum. When the inner gas plenum was used to perform an etch step, deposition was visible on the annular housing and in the vicinity of the inner gas plenum. In excess of 214 microns of PZT was successfully etched using the inner plenum before material de-laminated from the ceramic window of the annular housing.

Figure 3:
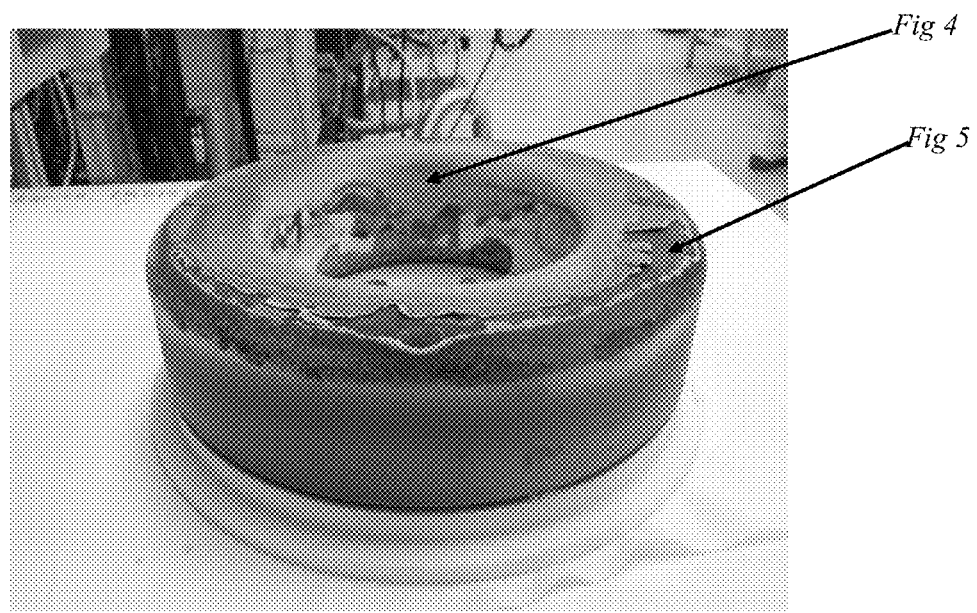

FIG. 3 shows material deposited on the annular housing 18. It can be seen that the material is well-adhered in some areas while it is flaking off in others.

Figure 4:
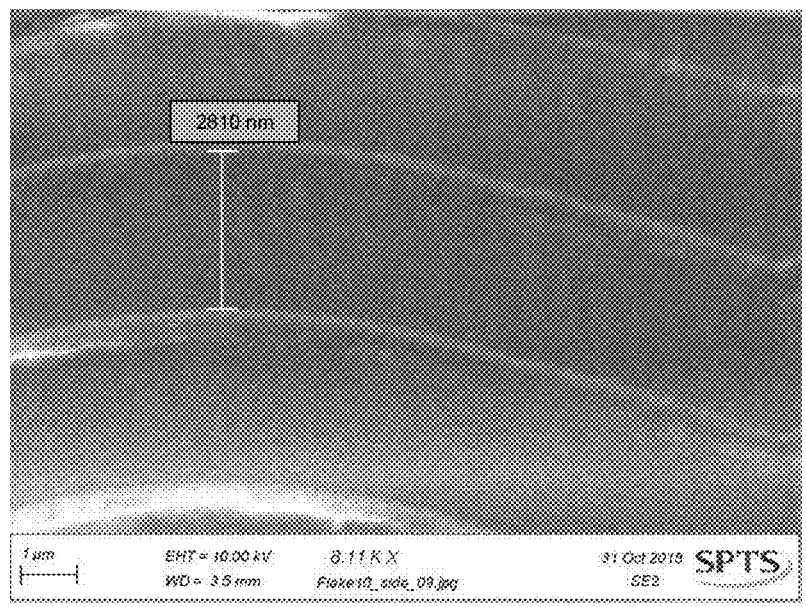
FIG. 4 is an SEM micrograph of the well-adhered section indicated in FIG. 3.

The SEM micrograph shown in FIG. 4 corresponds to the well-adhered area indicated in FIG. 3. Thick layers of fluorocarbon polymer are present between each layer of metallic etch products. As the number of wafers processed in the chamber increases, a laminar structure of etch products and fluorocarbon polymer builds up on the chamber interior.

Figure 5:
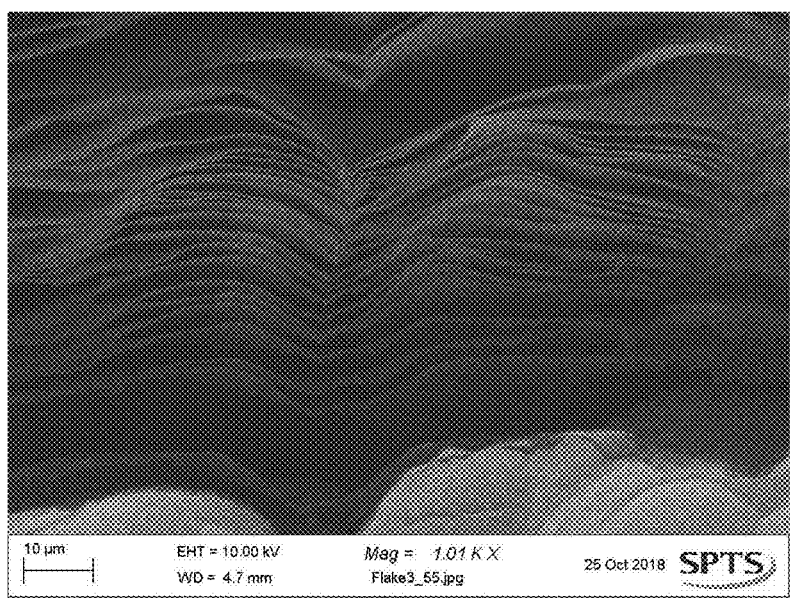
FIG. 5 is an SEM micrograph of the poorly-adhered section indicated in FIG. 3.

In contrast, the SEM micrograph in FIG. 5 is taken from the poorly-adhered area indicated in FIG. 3. In this area, there is a thin or non-existent fluorocarbon layer between the etch product layers. The SEM images indicate that regions where there is a thick fluorocarbon polymer layer between each redeposited etch product layer adhere better than regions where the fluorocarbon layer is thin or absent.

Figure 6:
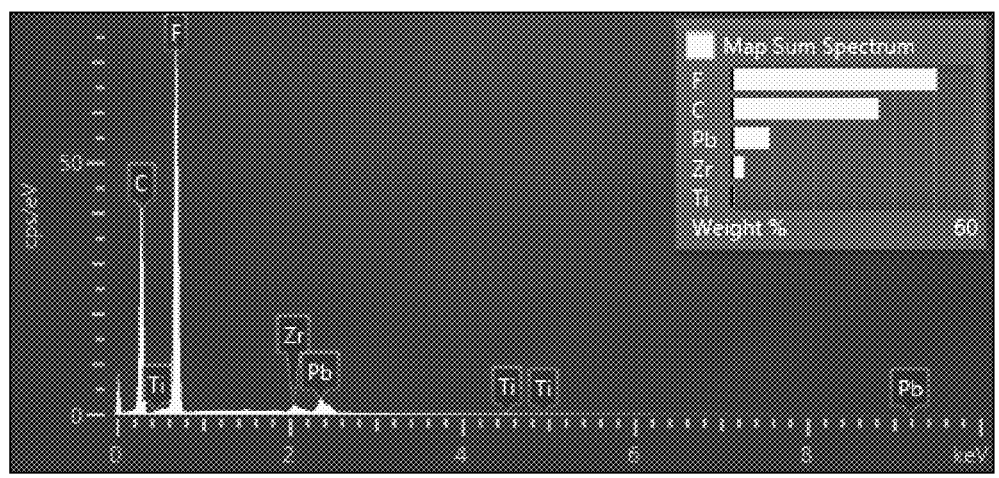
FIG. 6 shows EDX compositional analysis of deposited material layers.

FIG. 6 shows EDX compositional analysis of redeposited material taken from the well-adhered area. The composition of the material is consistent with the presence of thick fluorocarbon layers sandwiched between layers of metal etch product as seen in FIG. 4.

Without wishing to be limited by any particular theory or conjecture, it is believed that there are two main mechanisms of deposition on the chamber interior. The first mechanism is direct deposition of the process gas on the chamber interior. The second is redeposition of etch products from the wafer during etching. It is believed that material deposition from the etch process gas mixture varies throughout the chamber due to local variation in the precursor gas concentration as a function of distance from the gas inlet. This leads to higher deposition in the vicinity of the gas inlets. By switching between two gas inlet arrangements a more uniform deposition can be achieved, and the time between chamber cleans is extended accordingly. Deposition from the wafer etch products is believed to act in a line-of-sight manner from the wafer, and is therefore not affected by the gas inlets. The invention described herein is primarily concerned with deposition of the fluorocarbon polymer layer which acts as an excellent substrate for the deposition of a subsequent layer of the involatile metal products. This can be performed in conjunction with switching the gas inlets between the first and second plasma etch steps to achieve optimal results. However, it is not necessary that the switching of gas inlets is performed. Instead, it will be appreciated that the advantageous laminar structure comprising alternating layers of involatile metal etch product and fluorocarbon polymer can be achieved without switching of the gas inlets.

It is believed that the thickness of the fluorocarbon film can be modified by variation of process parameters such as RF coupling, the temperature of the surface being deposited onto and local variation in the concentration of the fluorocarbon precursor or precursors used to provide the fluorocarbon polymer layer. Such variation is within the ambit of the skilled reader.

What is claimed is:

1. A method of plasma etching a structure comprising a substrate and a layer of PZT (lead zirconate titanate), the method comprising the steps of:
providing a structure comprising a substrate and a layer of PZT;
positioning the structure on a support within a chamber;
etching the layer of PZT by performing a first plasma etch step in which a first etch process gas mixture is supplied to the chamber, wherein the first etch process gas mixture comprises at least one fluorine containing species and the first plasma etch step is performed so that involatile metal etch products are deposited onto interior surfaces of the chamber; and
further etching the layer of PZT by performing a second plasma etch step in which a second etch process gas mixture is supplied to the chamber, wherein the second etch process gas mixture is different from the first etch process gas mixture and comprises at least one fluorocarbon species, and wherein the second plasma etch step is performed so that a fluorocarbon polymer layer is deposited onto the interior surfaces of the chamber to overlay the involatile metal etch products deposited in the first plasma etch step and such that further involatile metal etch products are deposited on the overlay.

2. The method according to claim 1, wherein the at least one fluorocarbon species of the second etch process gas mixture comprises $C_4F_8$.

3. The method according to claim 2, wherein the $C_4F_8$ is introduced into the chamber at a flow rate of 5-10 sccm.

4. The method according to claim 2, wherein the at least one fluorocarbon species of the second etch process gas mixture further comprises $CF_4$ and the second etch process gas mixture further comprises $H_2$, wherein the ratio of $CF_4$ to $H_2$, expressed as a ratio of flow rates in sccm, is less than 1.0:1.

5. The method according to claim 1, wherein the at least one fluorocarbon species of the second etch process gas mixture comprises $C_3F_8$.

6. The method according to claim 1, wherein the at least one fluorine containing species of the first etch process gas mixture comprises one or more of $CF_4$, $CHF_3$ or $SF_6$.

7. The method according to claim 6, wherein the first etch process gas mixture further comprises $H_2$.

8. The method according to claim 7, wherein the first etch process gas mixture comprises $CF_4$ and $H_2$, wherein the ratio of $CF_4$ to $H_2$, expressed as a ratio of flow rates in sccm, is 1.5:1 or greater.

9. The method according to claim 1, wherein the first etch process gas mixture consists essentially of $CF_4$, $H_2$ and, optionally, one or more inert diluents.

10. The method according to claim 1, wherein the second etch process gas mixture consists essentially of $C_4F_8$, $CF_4$, $H_2$ and, optionally, one or more inert diluents.

11. The method according to claim 1, wherein an electrical bias power is applied to the structure during the first plasma etch step, and a reduced or zero electrical bias power is applied to the structure during the second plasma etch step.

12. The method according to claim 11, wherein an electrical bias power of 500-1000 W is applied to the structure during the first plasma etch step.

13. The method according to claim 11, wherein an electrical bias power of 0-500 W is applied to the structure during the second plasma etch step.

14. The method according to claim 1, wherein the substrate is a semiconductor substrate.

15. The method according to claim 14, wherein the semiconductor substrate is a silicon substrate.

16. The method according to claim 1, wherein:
- the chamber has a first gas inlet arrangement comprising one or more gas inlets and a second gas inlet arrangement comprising one or more gas inlets;
- during the first plasma etch step, the first etch process gas mixture is only supplied to the chamber through the first gas inlet arrangement; and
- during the second plasma etch step, the second etch process gas mixture is only supplied to the chamber through the second gas inlet arrangement.

* * * * *